(12) United States Patent
Lin

(10) Patent No.: US 8,933,341 B2
(45) Date of Patent: Jan. 13, 2015

(54) TOUCH DEVICE WITH PHOTOVOLATIC CONVERSION FUNCTION

(71) Applicant: Chih-Chung Lin, Taipei (TW)

(72) Inventor: Chih-Chung Lin, Taipei (TW)

(73) Assignee: Chih-Chung Lin, Taipei (TW)

( * ) Notice: Subject to any disclaimer, the term of this patent is extended or adjusted under 35 U.S.C. 154(b) by 108 days.

(21) Appl. No.: 13/726,192

(22) Filed: Dec. 23, 2012

(65) Prior Publication Data

US 2014/0126123 A1   May 8, 2014

(30) Foreign Application Priority Data

Nov. 7, 2012 (TW) .............................. 101141314 A

(51) Int. Cl.
| | | |
|---|---|---|
| H05K 1/03 | (2006.01) | |
| H01L 31/04 | (2014.01) | |
| H04M 1/02 | (2006.01) | |
| H01L 31/048 | (2014.01) | |

(52) U.S. Cl.
CPC ............. *H01L 31/04* (2013.01); *H04M 1/0202* (2013.01); *H01L 31/0488* (2013.01); *Y02E 10/50* (2013.01)
USPC ........... 174/255; 345/168; 345/173; 345/175; 702/64; 349/116

(58) Field of Classification Search
CPC ........... G06F 3/02; G06F 3/033; G06F 3/042; G06F 3/0421; G06F 3/0202; G06F 3/0231; G06F 3/04886; G06F 19/00; H01L 27/14609; H01L 31/1055; H01L 31/022425
USPC ............. 174/255; 345/168, 173, 175; 702/64; 349/116
See application file for complete search history.

(56) References Cited

U.S. PATENT DOCUMENTS

| | | | | |
|---|---|---|---|---|
| 4,567,480 | A * | 1/1986 | Blanchard ...................... | 345/175 |
| 8,199,114 | B1 * | 6/2012 | Jaeger et al. .................. | 345/173 |
| 2007/0057793 | A1 * | 3/2007 | Alden ......................... | 340/572.1 |
| 2008/0238879 | A1 * | 10/2008 | Jaeger et al. ................... | 345/173 |
| 2010/0134735 | A1 * | 6/2010 | Nakamura et al. ............ | 349/116 |
| 2011/0298718 | A1 * | 12/2011 | Chang et al. ................... | 345/168 |
| 2012/0105370 | A1 * | 5/2012 | Moore ........................... | 345/174 |
| 2012/0160560 | A1 * | 6/2012 | Kajiya et al. ................. | 174/70 R |
| 2013/0021300 | A1 * | 1/2013 | Wassvik ......................... | 345/175 |
| 2013/0050147 | A1 * | 2/2013 | Tseng et al. ................... | 345/175 |
| 2013/0165653 | A1 * | 6/2013 | Inoue et al. .................... | 544/225 |

* cited by examiner

*Primary Examiner* — Xiaoliang Chen

(57) ABSTRACT

A touch device with photovoltaic conversion function includes a main body divided into a touch zone and a non-touch zone located immediately around the touch zone. A photovoltaic conversion layer is provided on a top of the touch zone. By providing the photovoltaic conversion layer on the top of the touch zone of the touch device, the photovoltaic conversion layer can have an increased light-absorption area to enable conversion of more light into more electric current for use by the touch device and accordingly, enable the touch device to have extended standby and operation time.

10 Claims, 5 Drawing Sheets

TOUCH DEVICE WITH PHOTOVOLATIC CONVERSION FUNCTION

This application claims the priority benefit of Taiwan patent application number 101141314 filed on Nov. 7, 2012.

FIELD OF THE INVENTION

The present invention relates to a touch device with photovoltaic conversion function, and more particularly to a touch device that includes a photovoltaic conversion layer provided on a top of a touch zone thereof, so that the photovoltaic conversion layer has an increased light-absorption area to convert more light into more electric current for use by the touch device, enabling the touch device to have effectively extended standby and operation time.

BACKGROUND OF THE INVENTION

Power supply plays a very important role in the length of standby and operation time of a general portable electronic device. The currently available portable electronic devices rely on the electric power supplied by their built-in battery to maintain operation thereof. For a portable electronic device that includes a touch device, more power will be consumed during its operation to thereby largely shorten the length of standby and operation time thereof.

One of the ways for solving the problem of large power consumption of the conventional portable electronic device is to combine a solar module with the portable electronic device. The solar module enables photovoltaic conversion and stores the converted electric energy in the built-in battery of the portable electronic device, so that the portable electronic device can have extended standby and operation time. The solar module is mainly arranged in a non-touch zone or a housing of the portable electronic device. For the solar module to absorb light irradiated thereon and convert the absorbed light into electric current, the portable electronic device must have a clear housing or allow the solar module to expose from the housing. As a result, the portable electronic device would disadvantageously have a large overall thickness.

SUMMARY OF THE INVENTION

A primary object of the present invention is to provide a touch device with photovoltaic conversion function, which includes a photovoltaic conversion layer having an increased light-absorption area to convert more light into more electric current for use by the touch device, enabling the touch device to have effectively extended standby and operation time.

To achieve the above and other objects, the touch device with photovoltaic conversion function according to the present invention includes a main body divided into a touch zone and a non-touch zone located immediately around the touch zone, and the touch zone has a photovoltaic conversion layer provided on a top thereof.

By combining the photovoltaic conversion layer with the main body of the touch device, more light can be absorbed and converted into electric energy by the photovoltaic conversion layer for storing in the touch device, so that the touch device can have extended standby and operation time.

Further, by providing the photovoltaic conversion layer in the touch zone of the main body of the touch device, the main body of the touch device can have a reduced overall thickness and it is not necessary to provide the touch device with a clear housing for the purpose of absorbing light to enable photovoltaic conversion.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
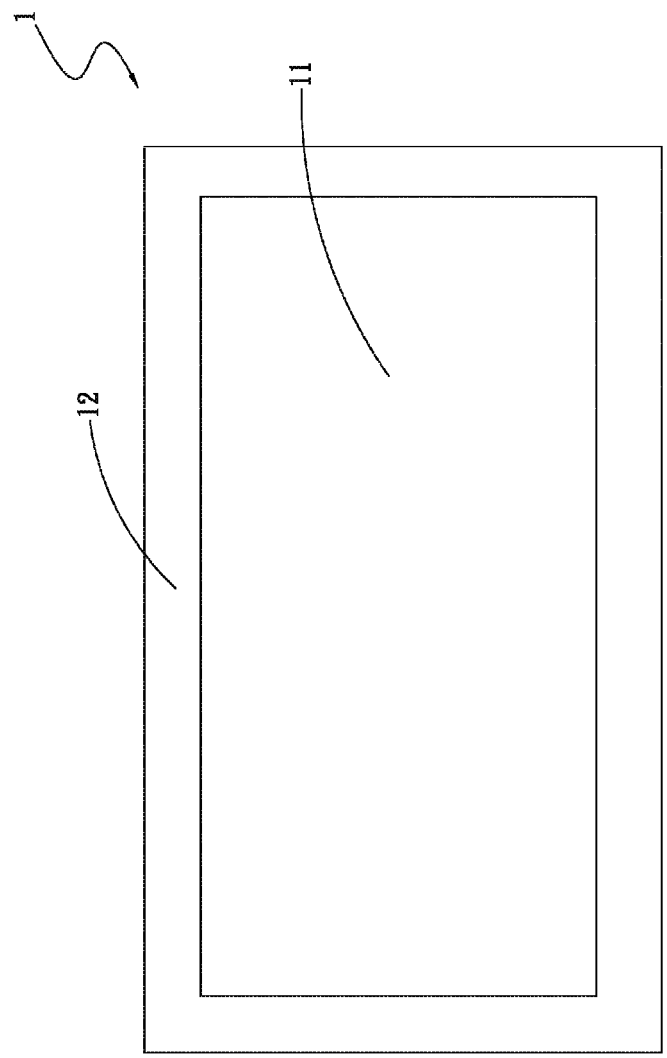
FIG. 1 is a top view of a touch device with photovoltaic conversion function according to the present invention.

The present invention will now be described with some preferred embodiments thereof and with reference to the accompanying drawings. For the purpose of easy to understand, elements that are the same in the preferred embodiments are denoted by the same reference numerals.

Figure 2:
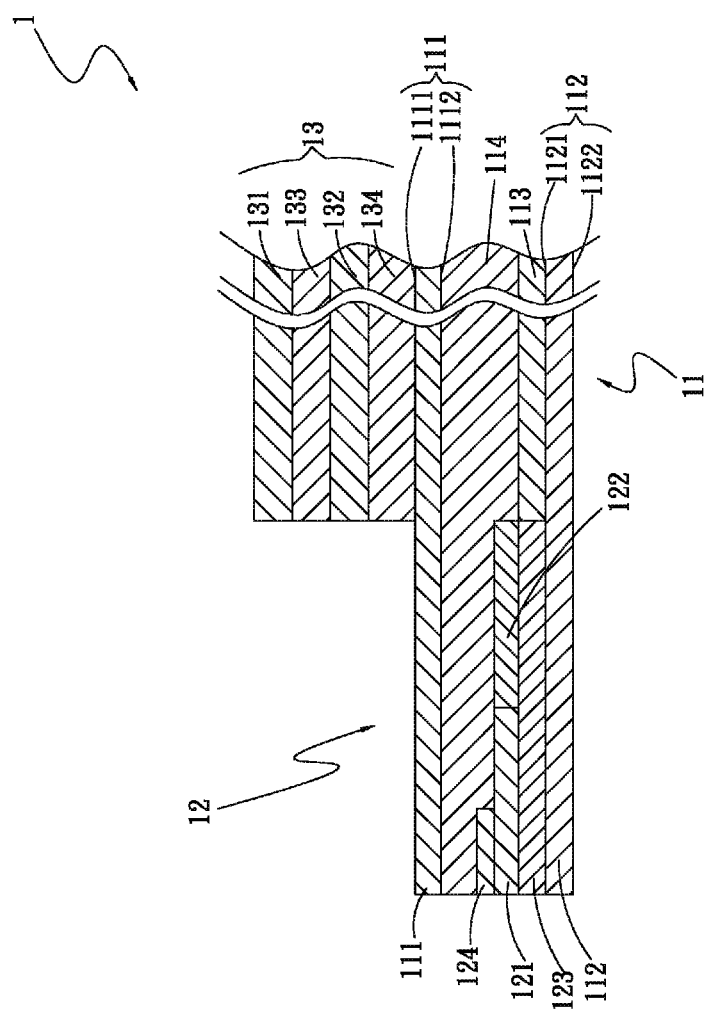
FIG. 2 is an assembled sectional view showing the structure of the touch device of the present invention according to a first embodiment thereof.

Please refer to FIG. 1 that is a top view of a touch device with photovoltaic conversion function according to the present invention, and to FIG. 2 that is an assembled sectional view showing the structure of the touch device of the present invention according to a first embodiment thereof. As shown, the touch device with photovoltaic conversion function includes a main body 1, which is divided into a touch zone 11 and a non-touch zone 12 located immediately around the touch zone 11. A photovoltaic conversion layer 13 is provided on a top of the touch zone 11.

The main body 1 includes a first transparent substrate 111, a second transparent substrate 112, at least one touch electrode layer 113, an adhesive layer 114, a conductive adhesive layer 121, a shielding layer 122, an electrode trace layer 123, and a flexible circuit board 124.

The first transparent substrate 111 has a first side 1111 and an opposite second side 1112; and the second transparent substrate 112 has a third side 1121 and an opposite fourth side 1122. The photovoltaic conversion layer 13 is provided on the first side 1111 of the first transparent substrate 111, and the touch electrode layer 113 can be selectively provided on the third side 1121 or the fourth side 1122 of the second transparent substrate 112. In the illustrated first embodiment, the touch electrode layer 113 is provided on the third side 1121. However, it is understood the touch electrode layer 113 can be otherwise provided on the fourth side 1122.

The touch electrode layer 113, the adhesive layer 114, the conductive adhesive layer 121, the shielding layer 122, the flexible circuit board 124 and the electrode trace layer 123 are located between the first and the second transparent substrate 111, 112. More specifically, the touch electrode layer 113 is located in the touch zone 11 of the main body 1; the flexible circuit board 124, the shielding layer 122, the electrode trace layer 123 and the conductive adhesive layer 121 are located in the non-touch zone 12. The conductive adhesive layer 121 is located between the flexible circuit board 124 and the electrode trace layer 123; and the shielding layer 122 is provided on a top of the electrode trace layer 123 and located adjacent to the conductive adhesive layer 121. The adhesive layer 114 is located between the flexible circuit board 124, the touch electrode layer 113 and the first transparent substrate 111. That is, in the first embodiment, the touch zone 11 includes, from top to bottom, the photovoltaic conversion layer 13, the first transparent substrate 111, the adhesive layer 114, the touch electrode layer 113, and the second transparent substrate 112; and the non-touch zone 12 includes, from top to bottom, the first transparent substrate 111, the adhesive layer 114, the flexible circuit board 124, the juxtaposed conductive adhesive layer 121 and shielding layer 122, the electrode trace layer 123, and the second transparent substrate 112.

Figure 3:
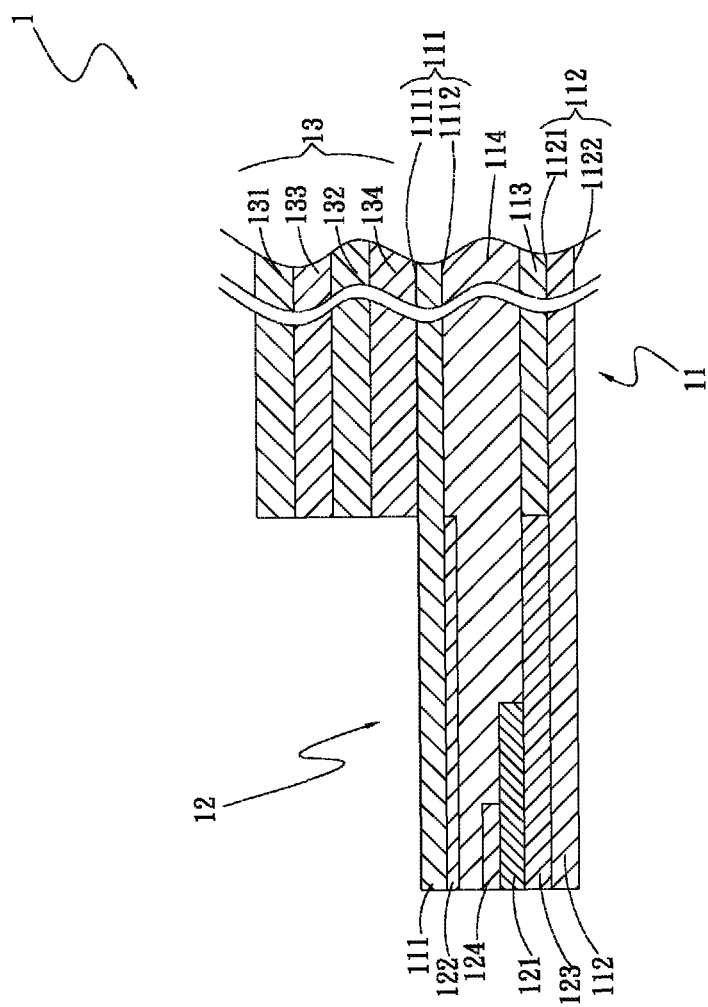
FIG. 3 is an assembled sectional view showing the structure of the touch device of the present invention according to a second embodiment thereof.

Please refer to FIG. 3 that is an assembled sectional view showing the structure of the touch device of the present invention according to a second embodiment thereof. As shown, the touch device with photovoltaic conversion function in the second embodiment is generally structurally similar to the first embodiment, except that the shielding layer 122 is provided on the second side 1112 of the first transparent substrate 111. That is, in the second embodiment, the touch zone 11 includes, from top to bottom, the photovoltaic conversion layer 13, the first transparent substrate 111, the adhesive layer 114, the touch electrode layer 113, and the second transparent substrate 112; and the non-touch zone 12 includes, from top to bottom, the first transparent substrate 111, the shielding layer 122, the adhesive layer 114, the flexible circuit board 124, the conductive adhesive layer 121, the electrode trace layer 123, and the second transparent substrate 112.

Figure 4:
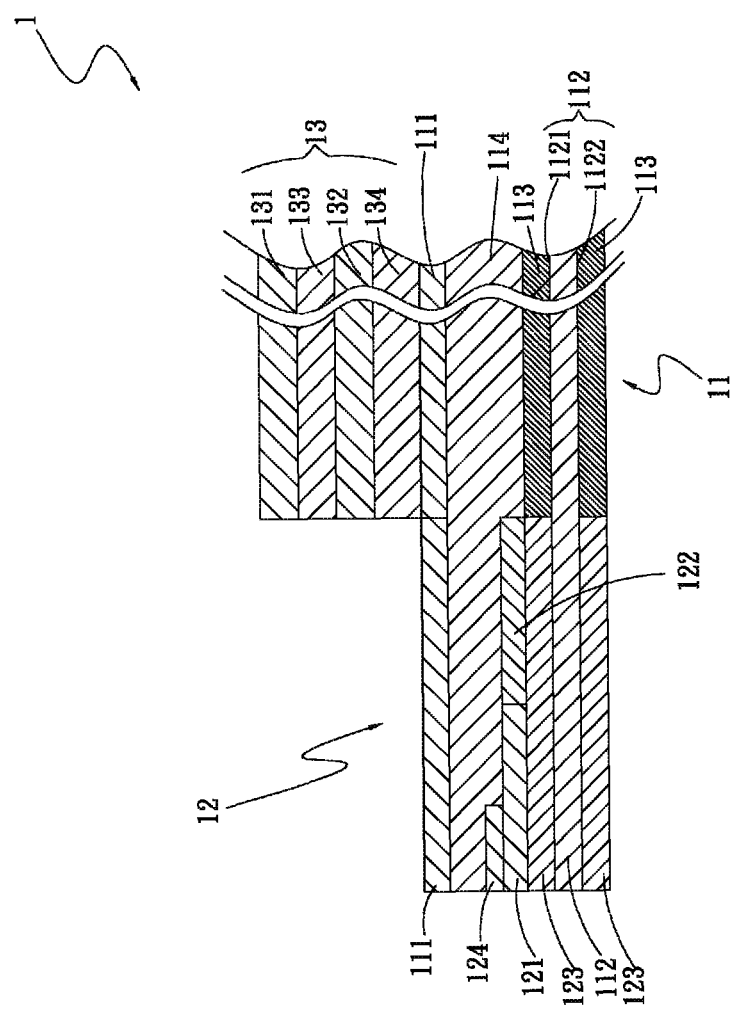
FIG. 4 is an assembled sectional view showing the structure of the touch device of the present invention according to a third embodiment thereof.

FIG. 4 is an assembled sectional view showing the structure of the touch device of the present invention according to a third embodiment thereof. As shown, the touch device with photovoltaic conversion function in the third embodiment is generally structurally similar to the first embodiment, except that an additional touch electrode layer 113 and an additional electrode trace layer 123 are provided on the fourth side 1122 of the second transparent substrate 112. Thus, in the third embodiment, the touch zone 11 includes, from top to bottom, the photovoltaic conversion layer 13, the first transparent substrate 111, the adhesive layer 114, the touch electrode layer 113, the second transparent substrate 112, and the other touch electrode layer 113; and the non-touch zone 12 includes, from top to bottom, the first transparent substrate 111, the adhesive layer 114, the flexible circuit board 124, the juxtaposed conductive adhesive layer 121 and shielding layer 122, the electrode trace layer 123, the second transparent substrate 112, and the other electrode trace layer 123.

Figure 5:
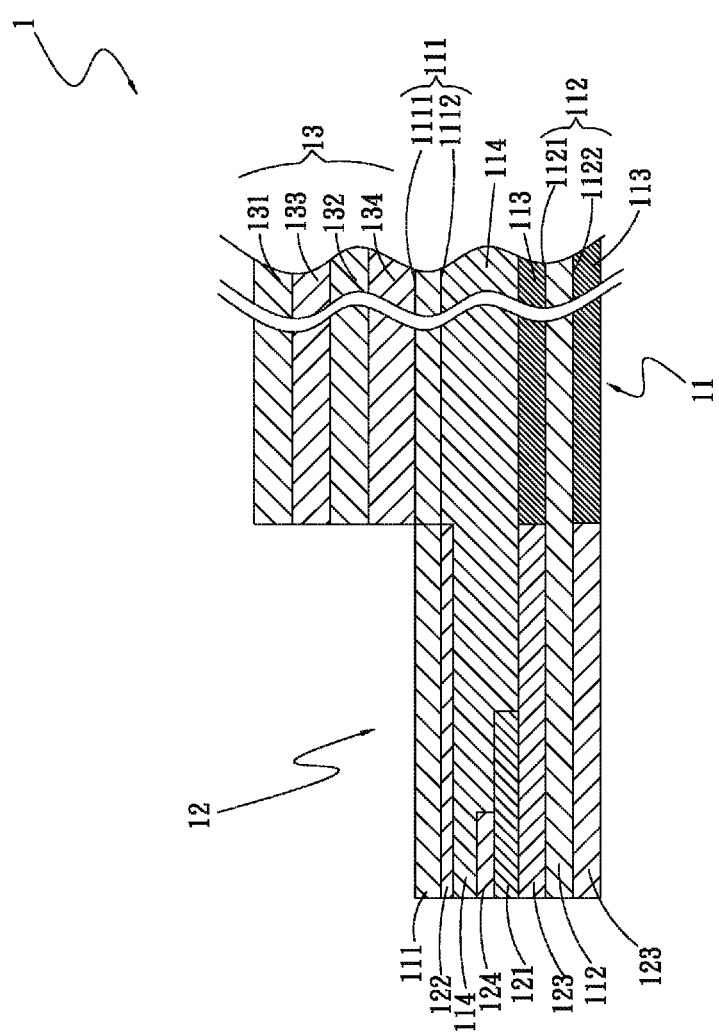
FIG. 5 is an assembled sectional view showing the structure of the touch device of the present invention according to a fourth embodiment thereof.

FIG. 5 is an assembled sectional view showing the structure of the touch device of the present invention according to a fourth embodiment thereof. As shown, the touch device with photovoltaic conversion function in the fourth embodiment is generally structurally similar to the third embodiment, except that the shielding layer 122 is provided on the second side 1112 of the first transparent substrate 111. That is, in the fourth embodiment, the touch zone 11 includes, from top to bottom, the photovoltaic conversion layer 13, the first transparent substrate 111, the adhesive layer 114, the touch electrode layer 113, the second transparent substrate 112 and the other touch electrode layer 113; and the non-touch zone 12 includes, from top to bottom, the first transparent substrate 111, the shielding layer 122, the adhesive layer 114, the flexible circuit board 124, the conductive adhesive layer 121, the electrode trace layer 123, the second transparent substrate 112, and the other electrode trace layer 123.

The photovoltaic conversion layer 13 in each of the first, the second, the third and the fourth embodiment includes an anti-reflective layer 131 and a light-absorption layer 132. A first transparent electrode layer 133 and a second transparent electrode layer 134 are provided on two opposite sides of the light-absorption layer 132, and the anti-reflective layer 131 is located on one side of the first transparent layer 133 opposite to the light-absorption layer 132. In the present invention, the photovoltaic conversion layer 13 is a thin-film solar cell.

In the present invention, the first and the second transparent substrate 111, 112 can be respectively made of polyethylene terephthalate (PET), polycarbonate (PC), polyethylene (PE), polyvinylchloride (PVC), polypropylene (PP), polystyrene (PS), polymethylmethacrylate (PMMA), cyclo olefin copolymer (COC) or glass. In the first embodiment, the first transparent substrate 111 is glass while the second transparent substrate 112 can be any one of the above-mentioned materials. Further, in the present invention, the adhesive layer 114 can be a layer of optical clear resin (OCR) or an optical clear adhesive (OCA).

The touch electrode layer 113 is a thin-film structure, which can be formed on the second transparent substrate 112 by applying a gel layer, electrical plating, vapor deposition or sputtering deposition. And, the thin-film structure of the touch electrode layer 113 can be indium tin oxide (ITO), indium zinc oxide (IZO) or antimony tin oxide (ATO).

The present invention has been described with some preferred embodiments thereof and it is understood that many changes and modifications in the described embodiments can be carried out without departing from the scope and the spirit of the invention that is intended to be limited only by the appended claims.

What is claimed is:

1. A touch device with photovoltaic conversion function, comprising a main body divided into a touch zone and a non-touch zone located immediately around the touch zone; and the touch zone having a photovoltaic conversion layer provided on a top thereof;
wherein the photovoltaic conversion layer includes an anti-reflective layer and a light-absorption layer; a first transparent electrode layer and a second transparent electrode layer being provided on two opposite sides of the light-absorption layer; and the anti-reflective layer being located on one side of the first transparent layer opposite to the light-absorption layer.

2. The touch device with photovoltaic conversion function as claimed in claim 1, wherein the main body includes a first transparent substrate, a second transparent substrate, at least one touch electrode layer, an adhesive layer, a conductive adhesive layer, a shielding layer, an electrode trace layer and a flexible circuit board; the first transparent substrate having a first side and an opposite second side, and the second transparent substrate having a third side and an opposite fourth side; the photovoltaic conversion layer being provided on the first side of the first transparent substrate; the touch electrode layer being selectively provided on one of the third and the fourth side of the second transparent substrate; the touch electrode layer, the adhesive layer, the conductive adhesive layer, the flexible circuit board and the electrode trace layer being located between the first and the second transparent substrate; the touch electrode layer being located in the touch zone of the main body; the flexible circuit board, the shielding layer, the electrode trace layer and the conductive adhesive layer being located in the non-touch zone of the main body; the conductive adhesive layer being located between the flexible circuit board and the electrode trace layer; the shielding layer being provided on one side of the electrode trace layer and located adjacent to the conductive adhesive layer; and the adhesive layer being provided between the flexible circuit board, the touch electrode layer and the first transparent substrate.

3. The touch device with photovoltaic conversion function as claimed in claim 1, wherein the main body includes a first transparent substrate, a second transparent substrate, at least one touch electrode layer, an adhesive layer, a conductive adhesive layer, a shielding layer, an electrode trace layer and a flexible circuit board; the first transparent substrate having a first side and an opposite second side, and the second transparent substrate having a third side and an opposite fourth side; the photovoltaic conversion layer being provided on the first side of the first transparent substrate; the third and the fourth side of the second transparent substrate being respectively provided with one touch electrode layer and one electrode trace layer; the touch electrode layers, the adhesive layer, the conductive adhesive layer, the shielding layer, the flexible circuit board and the electrode trace layers being located between the first and the second transparent substrate; the touch electrode layers being located in the touch zone of the main body; the flexible circuit board, the shielding layer, the electrode trace layers and the conductive adhesive layer being located in the non-touch zone of the main body; the conductive adhesive layer being located between the flexible circuit board and the electrode trace layer provided on the third side of the second transparent substrate; the shielding layer being located on the electrode trace layer provided on the third side of the second transparent substrate and adjacent to the conductive adhesive layer; and the adhesive layer being provided between the flexible circuit board, the touch electrode layer provided on the third side of the second transparent substrate, and the first transparent substrate.

4. The touch device with photovoltaic conversion function as claimed in claim 1, wherein the photovoltaic conversion layer is a thin-film solar cell.

5. The touch device with photovoltaic conversion function as claimed in claim 2, wherein the first and the second transparent substrate are respectively made of a material selected from the group consisting of polyethylene terephthalate (PET), polycarbonate (PC), polyethylene (PE), polyvinylchloride (PVC), polypropylene (PP), polystyrene (PS), polymethylmethacrylate (PMMA), cyclo olefin copolymer (COC) and glass; and wherein the adhesive layer is selected from the group consisting of an optical clear resin (OCR) layer and an optical clear adhesive (OCA) layer.

6. The touch device with photovoltaic conversion function as claimed in claim 3, wherein the first and the second transparent substrate are respectively made of a material selected from the group consisting of polyethylene terephthalate (PET), polycarbonate (PC), polyethylene (PE), polyvinylchloride (PVC), polypropylene (PP), polystyrene (PS), polymethylmethacrylate (PMMA), cyclo olefin copolymer (COC) and glass; and wherein the adhesive layer is selected from the group consisting of an optical clear resin (OCR) layer and an optical clear adhesive (OCA) layer.

7. The touch device with photovoltaic conversion function as claimed in claim 2, wherein the touch electrode layer is a thin-film structure, which is formed on the second transparent substrate by a manner selected from the group consisting of applying a gel layer, electrical plating, vapor deposition and sputtering deposition; and the thin-film structure of the touch electrode layer being selected from the group consisting of indium tin oxide (ITO), indium zinc oxide (IZO) and antimony tin oxide (ATO).

8. The touch device with photovoltaic conversion function as claimed in claim 3, wherein the touch electrode layer is a thin-film structure, which is formed on the second transparent substrate by a manner selected from the group consisting of applying a gel layer, electrical plating, vapor deposition and sputtering deposition; and the thin-film structure of the touch electrode layer being selected from the group consisting of indium tin oxide (ITO), indium zinc oxide (IZO) and antimony tin oxide (ATO).

9. The touch device with photovoltaic conversion function as claimed in claim 1, wherein the main body includes a first transparent substrate, a second transparent substrate, at least one touch electrode layer, an adhesive layer, a conductive adhesive layer, a shielding layer, an electrode trace layer, and a flexible circuit board; the first transparent substrate having a first side and an opposite second side, and the second transparent substrate having a third side and an opposite fourth side; the photovoltaic conversion layer being provided on the first side of the first transparent substrate; the touch electrode layer being selectively provided on one of the third and the fourth side of the second transparent substrate; the touch electrode layer, the adhesive layer, the conductive adhesive layer, the shielding layer, the flexible circuit board and the electrode trace layer being located between the first and the second transparent substrate; the touch electrode layer being located in the touch zone of the main body; the flexible circuit board, the shielding layer, the electrode trace layer and the conductive adhesive layer being located in the non-touch zone of the main body; the conductive adhesive layer being located between the flexible circuit board and the electrode trace layer; the shielding layer being provided on the second side of the first transparent substrate; and the adhesive layer being provided between the flexible circuit board, the touch electrode layer, the shielding layer and the first transparent substrate.

10. The touch device with photovoltaic conversion function as claimed in claim 1, wherein the main body includes a first transparent substrate, a second transparent substrate, at least one touch electrode layer, an adhesive layer, a conductive adhesive layer, a shielding layer, an electrode trace layer, and a flexible circuit board; the first transparent substrate having a first side and an opposite second side, and the second transparent substrate having a third side and an opposite fourth side; the photovoltaic conversion layer being provided on the first side of the first transparent substrate; the third and the fourth side of the second transparent substrate being respectively provided with one touch electrode layer and one electrode trace layer; the touch electrode layers, the adhesive layer, the conductive adhesive layer, the shielding layer, the flexible circuit board and the electrode trace layers being located between the first and the second transparent substrate; the touch electrode layers being located in the touch zone of the main body; the flexible circuit board, the shielding layer, the electrode trace layers and the conductive adhesive layer being located in the non-touch zone of the main body; the conductive adhesive layer being located between the flexible circuit board and the electrode trace layer on the third side of the second transparent substrate; the shielding layer being provided on the second side of the first transparent substrate; and the adhesive layer being provided between the flexible circuit board, the touch electrode layer provided on the third side of the second transparent substrate, the shielding layer and the first transparent substrate.

* * * * *